(12) United States Patent
Sutton

(10) Patent No.: US 7,859,352 B2
(45) Date of Patent: Dec. 28, 2010

(54) SYSTEMS AND METHODS TO OVERCOME DC OFFSETS IN AMPLIFIERS USED TO START RESONANT MICRO-ELECTRO MECHANICAL SYSTEMS

(75) Inventor: Michael Sutton, Roseville, MN (US)

(73) Assignee: Honeywell International Inc., Morristown, NJ (US)

( * ) Notice: Subject to any disclaimer, the term of this patent is extended or adjusted under 35 U.S.C. 154(b) by 129 days.

(21) Appl. No.: 12/252,176

(22) Filed: Oct. 15, 2008

(65) Prior Publication Data

US 2010/0090773 A1 Apr. 15, 2010

(51) Int. Cl.
*H03B 5/32* (2006.01)
*H01L 41/107* (2006.01)
*H03L 5/00* (2006.01)

(52) U.S. Cl. .................. 331/160; 331/154; 331/183; 331/185; 310/318; 310/319

(58) Field of Classification Search ............. 331/116 M, 331/116 R, 154, 156, 158, 160, 185, 186, 331/182, 183; 310/311, 318, 319
See application file for complete search history.

(56) References Cited

U.S. PATENT DOCUMENTS

| | | | |
|---|---|---|---|
| 5,481,914 A * | 1/1996 | Ward | 73/504.16 |
| 6,515,751 B1* | 2/2003 | Craighead et al. | 356/519 |
| 2006/0033588 A1* | 2/2006 | Caminada et al. | 331/154 |
| 2008/0105054 A1* | 5/2008 | Kanai et al. | 73/514.29 |

* cited by examiner

*Primary Examiner*—Robert Pascal
*Assistant Examiner*—Levi Gannon
(74) *Attorney, Agent, or Firm*—Fogg & Powers LLC

(57) ABSTRACT

Systems and methods for insuring successful initiation of a resonating micro-electro mechanical systems (MEMS). An example system includes a resonating sensor, a drive device, a charge amplifier, and a voltage gain circuit. At start up, the charge amplifier and voltage gain circuit receives signals from the resonating sensor, compensates this signal for DC offsets, and generates a clock signal for the drive, thus placing the resonating sensor in a steady state operating mode. The circuit includes a plurality of gain switches that are toggled to produce a glitch in the signal associated with the received signal. The glitch overcomes the DC offset. A comparator generates the clock signal for the drive device if a signal associated with the received signal exceeds a reference signal.

11 Claims, 2 Drawing Sheets

SYSTEMS AND METHODS TO OVERCOME DC OFFSETS IN AMPLIFIERS USED TO START RESONANT MICRO-ELECTRO MECHANICAL SYSTEMS

BACKGROUND OF THE INVENTION

Start up of the MEMS gyro is performed by amplifying electronics noise, which goes into a comparator which then drives logic that generates a drive waveform. The input of the initial drive stage (charge amplifier) often includes electrostatic discharge (ESD) protection, such as an ESD diode. The ESD protection can often introduce a leakage current, which leads to a DC offset. If that DC offset is too large, a comparator in the initial drive stage never switches (no clock signal is sent to a drive component), no drive signal is generated, and the sensor never starts. Although it is possible to solve this problem by adding a low frequency high pass filter, this consumes valuable board space or die space within the application specific integrated circuit (ASIC).

SUMMARY OF THE INVENTION

The present invention provides systems and methods for insuring successful initiation of a resonating micro-electro mechanical systems (MEMS). An example system includes a resonating sensor, a drive device, a variable gain charge amplifier, and a variable gain voltage amplifier. At start up, the charge amplifier receives signals from the resonating sensor, compensates this signal for a DC offset, and generates a clock signal for the drive device, thus placing the resonating sensor in a steady state operating mode.

In one aspect of the invention, the circuit includes a plurality of gain switches being controllable for adjusting gain of the circuit. The circuit includes a comparator that generates the clock signal for the drive device if a signal associated with the received signal exceeds a reference signal. Toggling of the gain switches produces a glitch in the signal associated with the received signal, which in turn causes the comparator to switch. The zero crossing of the comparator causes a cycle of the drive to be generated. The drive adds energy to the resonator. The displacement of the resonator becomes visible at the output of the charge amplifier and overcomes the DC offset.

In another aspect of the invention, the controller toggles one or more of the gain switches at a predefined frequency. The predefined frequency corresponds to a desired resonance of the sensor.

BRIEF DESCRIPTION OF THE DRAWINGS

Preferred and alternative embodiments of the present invention are described in detail below with reference to the following drawings.

DETAILED DESCRIPTION OF THE INVENTION

Figure 1:
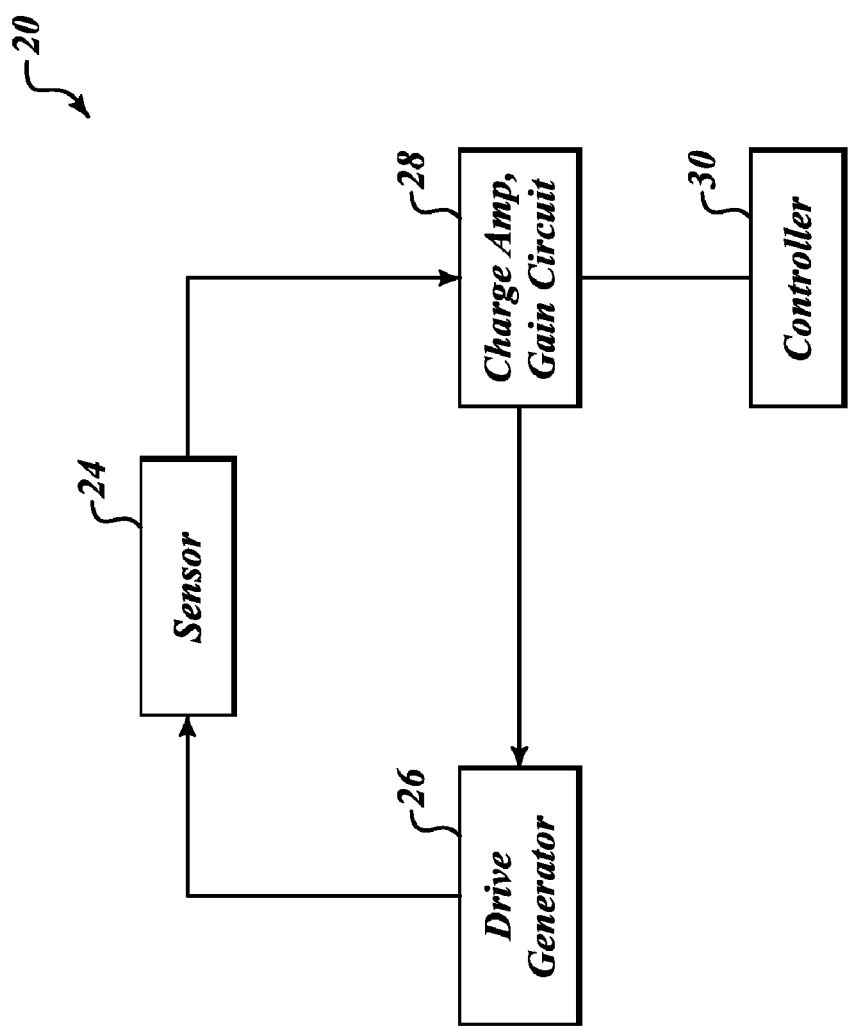
FIG. 1 illustrates a block diagram of an example system formed in accordance with the present invention.

FIG. 1 illustrates a resonating micro-electro mechanical systems (MEMS) device 20 that overcomes a DC offset introduced by electrostatic discharge (ESD) components (e.g., diode), thereby avoiding a situation where the MEMS device 20 fails to start.

The MEMS device 20 includes one or more sensors 24, a drive generator 26, a charge amp, gain circuit 28, and a controller 30. The drive generator 26 and the charge amp and voltage gain circuit 28 are in signal communication with the sensors 24 (e.g. resonating proof mass or double-ended tuning fork). The controller 30 is in signal communication with components of the gain circuit 28. The controller 30 causes the charge amplifier and voltage gain circuit 28 to produce a spiked signal that is large enough to overcome any experienced DC offset, thereby allowing the gain circuit 28 to output a clock signal for the drive generator 26.

Figure 2:
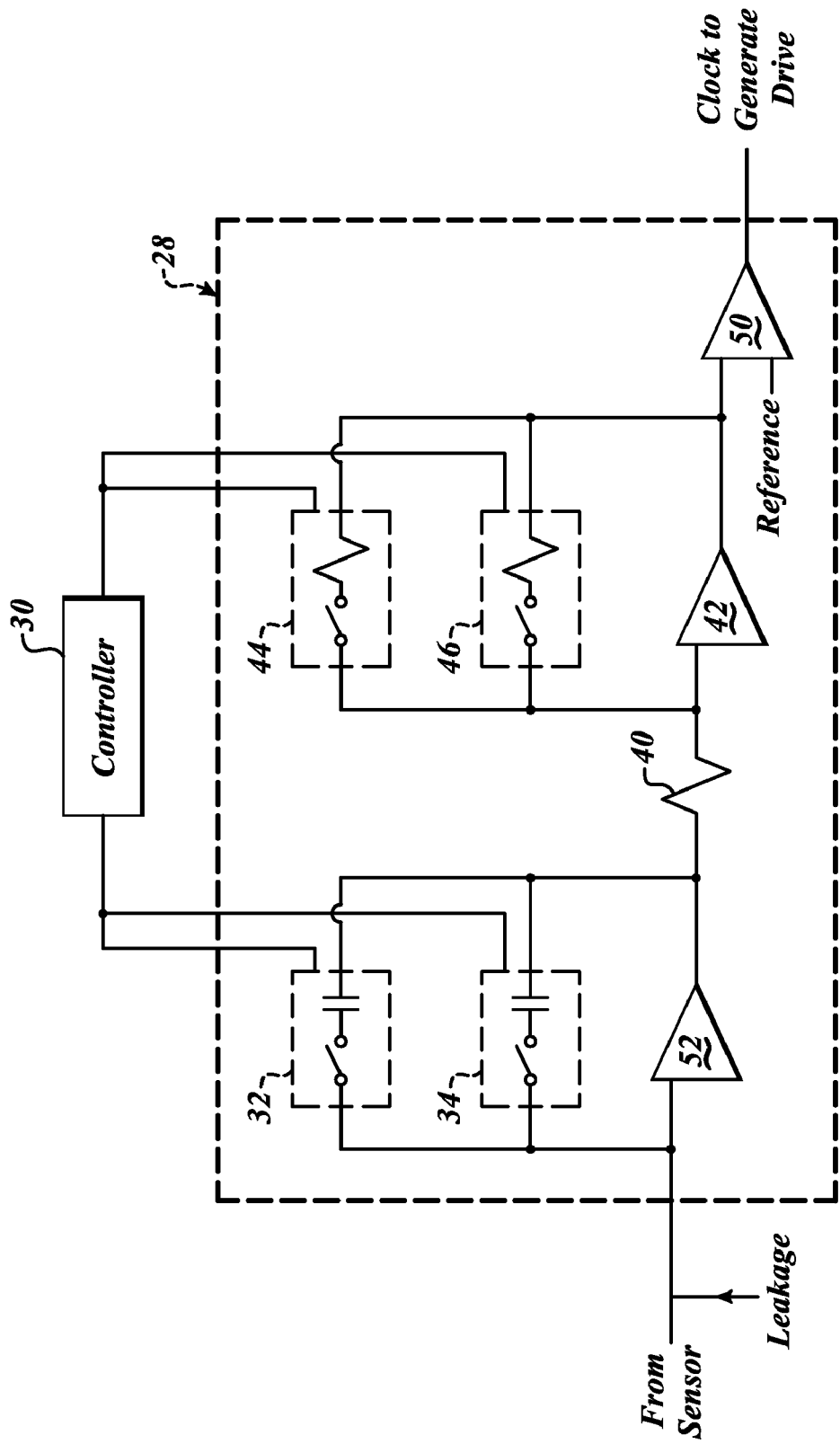
FIG. 2 illustrates components of the charge amplifier and voltage gain circuit of FIG. 2.

FIG. 2 illustrates an example configuration of the charge amplifier and voltage gain circuit 28. The circuit 28 includes a first charge amplifier 52 (op-amp with feedback capacitor) that receives an ESD protected signal from the resonating MEMS device 20 with switch/capacitor pairs 32, 34 connected in parallel between the input and output terminals. In normal operation, different capacitance values can be selected for different charge amplifier gains. A resistor 40 is located between the output of the first amplifier 52 and an input to a second amplifier 42 (inverting amplifier). Multiple switch/resistor pairs 44, 46 are connected in parallel between the input and an output terminal of the second amplifier 42. The output terminal of the second amplifier 42 is connected to an input of a comparator 50. The comparator 50 compares the input signal to a reference signal that is also a reference signal for the first and second amplifiers 52, 42.

In one embodiment, the switches in the switch pairs 32, 34, 44, 46 are connected to a controller 30. During start up of the device 20 (FIG. 1) the controller 30 toggles one of the switches in the switch pairs 32, 34, 44, 46. This introduces a transient signal or glitch in the signal path at the input to the comparator 50. If the glitch produced is bigger than the DC offset (caused by voltage leakage introduced by ESD protection components), the comparator 50 will trip, generate a clock, a motor drive, and permit start-up of the resonator.

If the gains are changed rapidly (at or near a desired drive/motor frequency of the drive generator 26), a drive signal will be generated at the corresponding frequency. Therefore, the DC offset is overcome by rapidly switching the gains (the switches) until the actual resonator displacement has built up enough to overcome the DC offset.

The controller 30 is a hardware and/or software system that rapidly switches the gains (ideally at the resonator frequency) until the resonator amplitude has built up. Then, the device 20 continues running with the steady state gains.

In another embodiment, only one spike of the signal seen by the comparator 50 may be enough to allow the system to start.

While the preferred embodiment of the invention has been illustrated and described, as noted above, many changes can be made without departing from the spirit and scope of the invention. For example, the size of the capacitors and resistors used in the switch/capacitor and switch/resistor pairs 32, 34, 44, 46 may vary depending upon desired gains across the respective amplifier. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A resonating micro-electro mechanical systems (MEMS) device comprising:
   a resonating sensor;
   a drive device configured to send a drive signal to the resonating sensor; and a circuit configured to receive signals from the resonating sensor and generate a clock signal for the drive device that compensates for a DC offset to put the resonating sensor in a steady state operating mode;

wherein the circuit comprises a plurality of gain switches being controllable for adjusting gain of the circuit.

2. The device of claim 1, wherein the circuit comprises a comparator configured to generate the clock signal for the drive device if a signal associated with the received signal exceeds a reference signal.

3. The device of claim 2, further comprising a controller configured to control operation of at least one of the plurality of gain switches for producing a glitch in the signal associated with the received signal, wherein the glitch overcomes the DC offset.

4. The device of claim 3, wherein the controller toggles at least one of the plurality of gain switches at a predefined frequency.

5. The device of claim 4, wherein the predefined frequency corresponds to a desired frequency of the resonator.

6. A resonating micro-electro mechanical systems (MEMS) method comprising:

receiving signals from a resonating sensor; and a gain circuit generating a clock signal for a drive device that compensates for a DC offset to put the resonating sensor in a steady state operating mode;

wherein generating comprises controlling at least one of a plurality of gain switches for adjusting gain of the gain circuit.

7. The method of claim 6, wherein generating comprises generating the clock signal for the drive device if a signal associated with the received signal exceeds a reference signal.

8. The method of claim 7, wherein controlling operation of the at least one of the gain switches produces a glitch in the signal associated with the received signal, wherein the glitch overcomes the DC offset.

9. The method of claim 8, wherein controlling comprises toggling at least one of the plurality of gain switches at a predefined frequency.

10. The method of claim 9, wherein the predefined frequency corresponds to a desired frequency of a drive signal.

11. A resonating micro-electro mechanical systems (MEMS) device comprising:

a resonating sensor;

a drive device configured to send a drive signal to the resonating sensor; and a circuit configured to receive signals from the resonating sensor; and generate a clock signal for the drive device that compensates for a DC offset to put the resonating sensor in a steady state operating mode;

wherein the circuit is further configured to inject a noise signal controllable for adjusting gain of the circuit.

* * * * *